US008654593B2

(12) United States Patent
Oh et al.

(10) Patent No.: US 8,654,593 B2
(45) Date of Patent: Feb. 18, 2014

(54) STACKED SEMICONDUCTOR MEMORY DEVICE, MEMORY SYSTEM INCLUDING THE SAME, AND METHOD OF REPAIRING DEFECTS OF THROUGH SILICON VIAS

(75) Inventors: Tae-Young Oh, Songpa-gu (KR); Kwang-Il Park, Yongin-si (KR); Yun-Seok Yang, Hwaseong-si (KR); Young-Soo Sohn, Gangnam-gu (KR); Si-Hong Kim, Yongin-si (KR); Seung-Jun Bae, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 328 days.

(21) Appl. No.: 13/085,776

(22) Filed: Apr. 13, 2011

(65) Prior Publication Data

US 2011/0292742 A1 Dec. 1, 2011

(30) Foreign Application Priority Data

Jun. 1, 2010 (KR) ........................ 10-2010-0051733

(51) Int. Cl.
*G11C 7/10* (2006.01)
(52) U.S. Cl.
USPC ..................................... 365/189.05
(58) Field of Classification Search
USPC ..................................... 365/189.05
See application file for complete search history.

(56) References Cited

U.S. PATENT DOCUMENTS

| 2006/0001176 | A1 | 1/2006 | Fukaishi et al. |
| 2007/0132085 | A1 | 6/2007 | Shibata et al. |
| 2009/0096478 | A1 | 4/2009 | Keeth |
| 2010/0005376 | A1* | 1/2010 | LaBerge et al. ............... 714/819 |
| 2010/0195364 | A1* | 8/2010 | Riho ............................. 365/63 |
| 2010/0312954 | A1* | 12/2010 | Jeon et al. .................... 711/103 |
| 2011/0057819 | A1* | 3/2011 | Ide et al. ....................... 341/100 |
| 2013/0021866 | A1* | 1/2013 | Lee .......................... 365/230.01 |

FOREIGN PATENT DOCUMENTS

KR 1020090034785 A 4/2009

* cited by examiner

*Primary Examiner* — Hoai V Ho
*Assistant Examiner* — Pablo Huerta
(74) *Attorney, Agent, or Firm* — Harness, Dickey & Pierce, P.L.C.

(57) ABSTRACT

A stacked semiconductor memory device according to the inventive concepts may include a plurality of memory chips stacked above a processor chip, a plurality of TSVs, and I/O buffers. The TSVs may pass through the memory chips and are connected to the processor chip. I/O buffers may be coupled between all or part of the memory chips and the TSVs and may be selectively activated on the basis of defective states of the TSVs.

30 Claims, 16 Drawing Sheets

STACKED SEMICONDUCTOR MEMORY DEVICE, MEMORY SYSTEM INCLUDING THE SAME, AND METHOD OF REPAIRING DEFECTS OF THROUGH SILICON VIAS

CROSS-REFERENCE TO RELATED APPLICATION

This application claims priority under 35 U.S.C. §119 to Korean Patent Application No. 10-2010-0051733, filed on Jun. 1, 2010 with the Korean Intellectual Property Office, the disclosure of which is hereby incorporated by reference in its entirety.

BACKGROUND

1. Field

Embodiments of the inventive concepts relate to a semiconductor memory device and, more particularly, to a stacked semiconductor memory device in which a plurality of memory chips are three-dimensionally stacked and a memory system including the same.

2. Description of Related Art

Stacked semiconductor memory devices in which memory chips are three-dimensionally stacked using through silicon vias (TSVs) for ultra-high speed communication between semiconductor integration circuits as communication means have been studied.

A defect may occur in a process of manufacturing TSVs to connect memory chips in the stacked semiconductor memory devices. Accordingly, it is beneficial to manufacture TSVs having a higher manufacturing yield.

SUMMARY

Example embodiments of the inventive concepts relate to a stacked semiconductor memory device capable of repairing defects of TSVs and improving manufacturing yield.

Example embodiments of the inventive concepts additionally relate to a memory system including a stacked semiconductor memory device.

Example embodiments of the inventive concepts further relate to a method of repairing TSV defects in a stacked semiconductor memory device.

It should be understood that the inventive concepts are not limited to those specifically disclosed herein. Rather, other aspects may become apparent to those of ordinary skill in the art based on the following descriptions.

In accordance with a non-limiting aspect of the inventive concepts, a stacked semiconductor memory device may include a plurality of stacked memory chips. A plurality of through silicon vias (TSVs) may pass through all the memory chips. I/O buffers may be coupled between all or part of the memory chips and the TSVs. The I/O buffers may be configured to be selectively activated on the basis of defective states of the TSVs.

In some embodiments, the I/O buffers may be included inside the memory chips.

In some embodiments, when part of the TSVs is defective, an I/O buffer included in a memory chip located below a defective point may be activated among I/O buffers connected to a defective TSV.

In some embodiments, when part of the TSVs is defective, I/O buffers included in a memory chip located above a defective point may not be activated among I/O buffers connected to a defective TSV.

In some embodiments, each of the memory chips may include a buffer control circuit for enabling I/O buffers inside each of the memory chips on the basis of the defective states of the TSVs.

In some embodiments, the buffer control circuit may include a non-volatile memory device.

In some embodiments, the buffer control circuit may be OTP or EEPROM.

In some embodiments, each of the memory chips may independently have a buffer control circuit for each I/O buffer to enable I/O buffers inside each of the memory chips on the basis of the defective states of the TSVs.

In some embodiments, when a plurality of TSVs for an address/command and a plurality of TSVs for data are included and the data bus mapping is changed due to a defect of part of the TSVs for the data, the address/command bus mapping may also be changed.

In some embodiments, when a plurality of TSVs for an address/command and a plurality of TSVs for data are included and the address/command bus mapping is changed due to a defect of part of the TSVs for the address/command, the data bus mapping may also be changed.

In another non-limiting embodiment according to the inventive concepts, a stacked semiconductor memory device may include a plurality of memory chips stacked in a first direction; a plurality of I/O buffers disposed in each of the plurality of memory chips; and a plurality of through silicon vias (TSVs) extending in the first direction through the plurality of memory chips, each of the plurality of TSVs being coupled to at least two of the plurality of I/O buffers, the plurality of I/O buffers configured to be selectively activated if a defect is present in one or more of the plurality of TSVs.

In accordance with another non-limiting aspect of the inventive concepts, a memory system may include a processor chip. A plurality of memory chips may be stacked above the processor chip. A plurality of TSVs may pass through all the memory chips and may be connected to the processor chip. I/O buffers may be coupled between all or part of the memory chips and the TSVs. The I/O buffers may be configured to be selectively activated on the basis of defective states of the TSVs.

In some embodiments, when a plurality of TSVs for an address/command and a plurality of TSVs for data are included and the data bus mapping is changed due to a defect of part of the TSVs for the data, the address/command bus mapping may also be changed.

In some embodiments, the processor chip may include a repair circuit for recovering the changed data bus mapping to an original.

In some embodiments, the repair circuit may be included in a memory controller inside the processor chip.

In accordance with still another non-limiting aspect of the inventive concepts, a method of repairing defects of TSVs in a stacked semiconductor memory device may include coupling I/O buffers between all or part of a plurality of memory chips and TSVs. The I/O buffers may be selectively activated on the basis of defective states of the TSVs.

In some embodiments, selectively activating the I/O buffers may include activating an I/O buffer included in one memory chip located below a defective point among the I/O buffers connected to a defective TSV, and activating I/O buffers connected to non-defective TSVs.

In some embodiments, selectively activating the I/O buffers may include changing the data bus mapping due to a defect of part of TSVs for data, and also changing the address/command bus mapping.

BRIEF DESCRIPTION OF THE DRAWINGS

The foregoing and other features and advantages of the inventive concepts will be apparent from the more particular description of non-limiting embodiments of the inventive concepts, as illustrated in the accompanying drawings in which like reference characters refer to the same parts throughout the different views. The drawings are not necessarily to scale, with the emphasis instead being placed upon illustrating the principles of the inventive concepts. In the drawings.

DETAILED DESCRIPTION OF THE EMBODIMENTS

Figure 1:
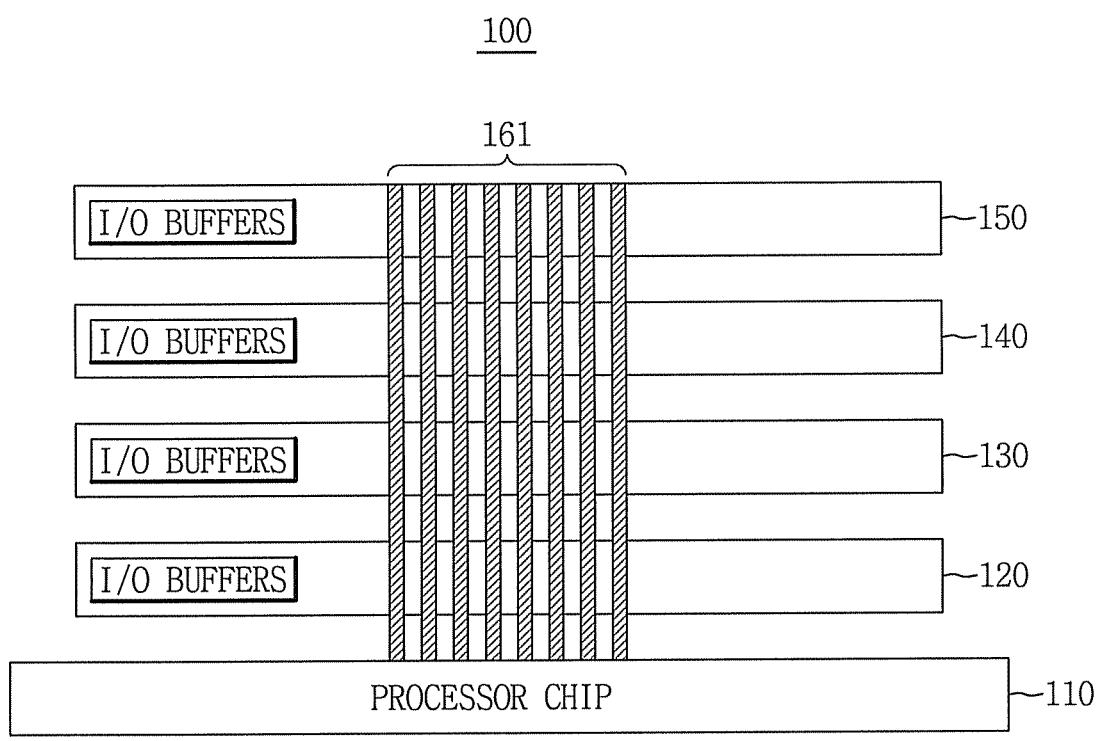
FIG. 1 is a schematic cross-sectional view showing a memory system including a stacked semiconductor memory device in accordance with a first embodiment of the inventive concepts.

Various embodiments will now be described more fully with reference to the accompanying drawings in which a few examples are shown. These inventive concepts may, however, be embodied in different forms and should not be construed as limited to the embodiments set forth herein. Rather, these embodiments are merely provided to ensure that the disclosure is thorough and complete and fully conveys the inventive concepts to those skilled in the art. In the drawings, the sizes and relative sizes of layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Non-limiting embodiments of the inventive concepts will now be described with reference to the accompanying drawings.

FIG. 1 is a schematic cross-sectional view showing a memory system 100 including a stacked semiconductor memory device in accordance with a first embodiment of the inventive concepts.

Referring to FIG. 1, the memory system 100 includes a processor chip, memory chips 120, 130, 140, and 150, and TSVs 161. The memory chips 120, 130, 140, and 150 are stacked above the processor chip, and constitute a stacked semiconductor memory device. The TSVs 161 pass through all the memory chips 120, 130, 140, and 150, and are connected to the processor chip. The memory chips 120, 130, 140, and 150 includes input/output (I/O) buffers coupled between all or part of the memory chips 120, 130, 140, and 150 and the TSVs 161. The I/O buffers are selectively activated on the basis of states of the TSVs 161.

Figure 2:
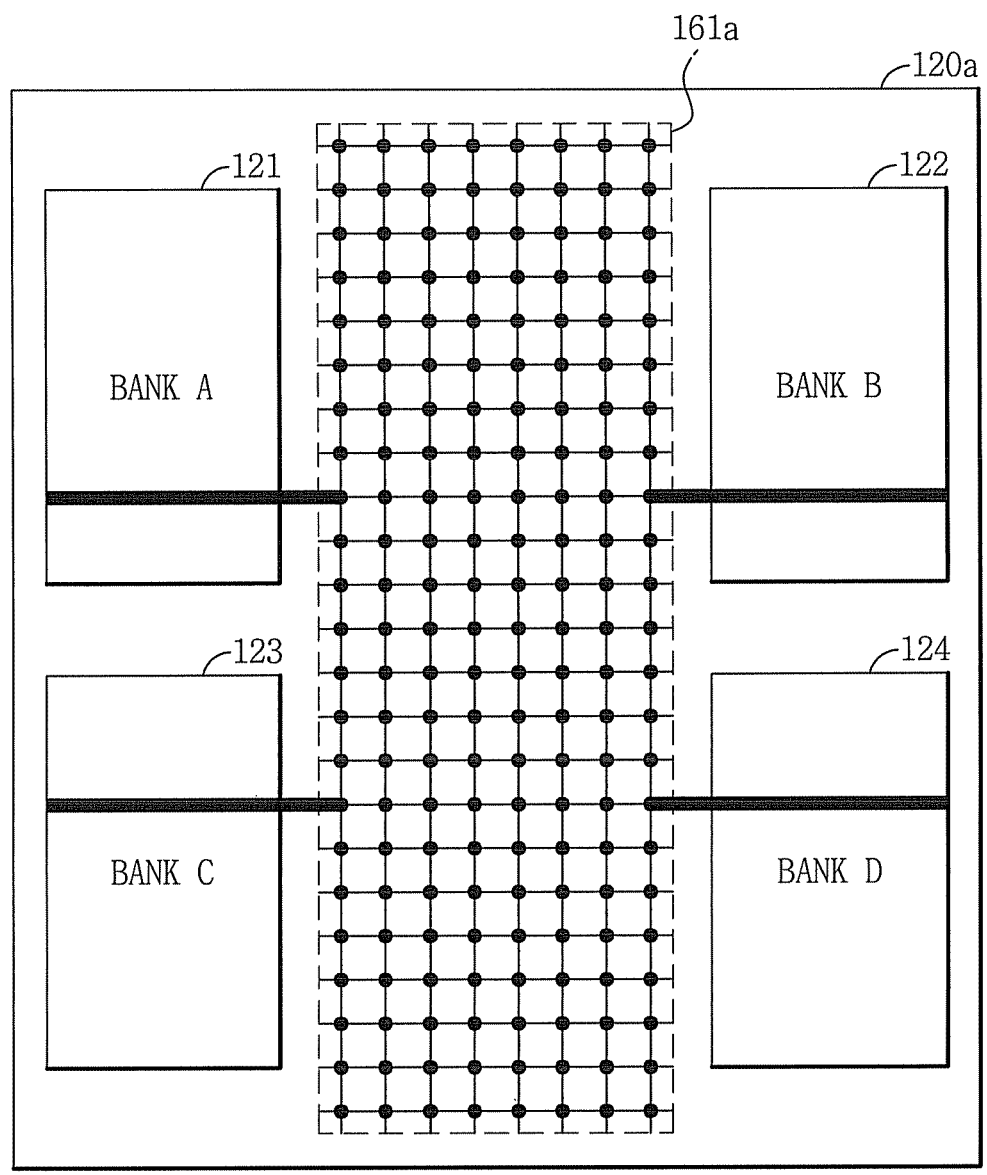
FIG. 2 is a plan view showing an example of a structure of a memory chip included in the memory system of FIG. 1.

FIG. 2 is a plan view showing an example of a structure of a memory chip included in the memory system 100 of FIG. 1.

Referring to FIG. 2, a memory chip 120a includes TSVs 161a and a memory core including memory banks 121, 122, 123, and 124. The I/O buffers as shown in FIG. 1 are connected between the memory banks 121, 122, 123, and 124 and the TSVs 161a, but are omitted from FIG. 2 for convenience of description. Internal electrodes which electrically connect the TSVs 161 to circuit blocks within the memory banks 121, 122, 123, and 124 are arranged on the memory banks 121, 122, 123, and 124. For convenience, one internal electrode for each memory bank is shown in FIG. 2. The TSVs 161 are arranged in center portions of the memory chips 120, 130, 140, and 150 in FIG. 1, but may be arranged in other positions of the memory chips 120, 130, 140, and 150.

Figure 3:
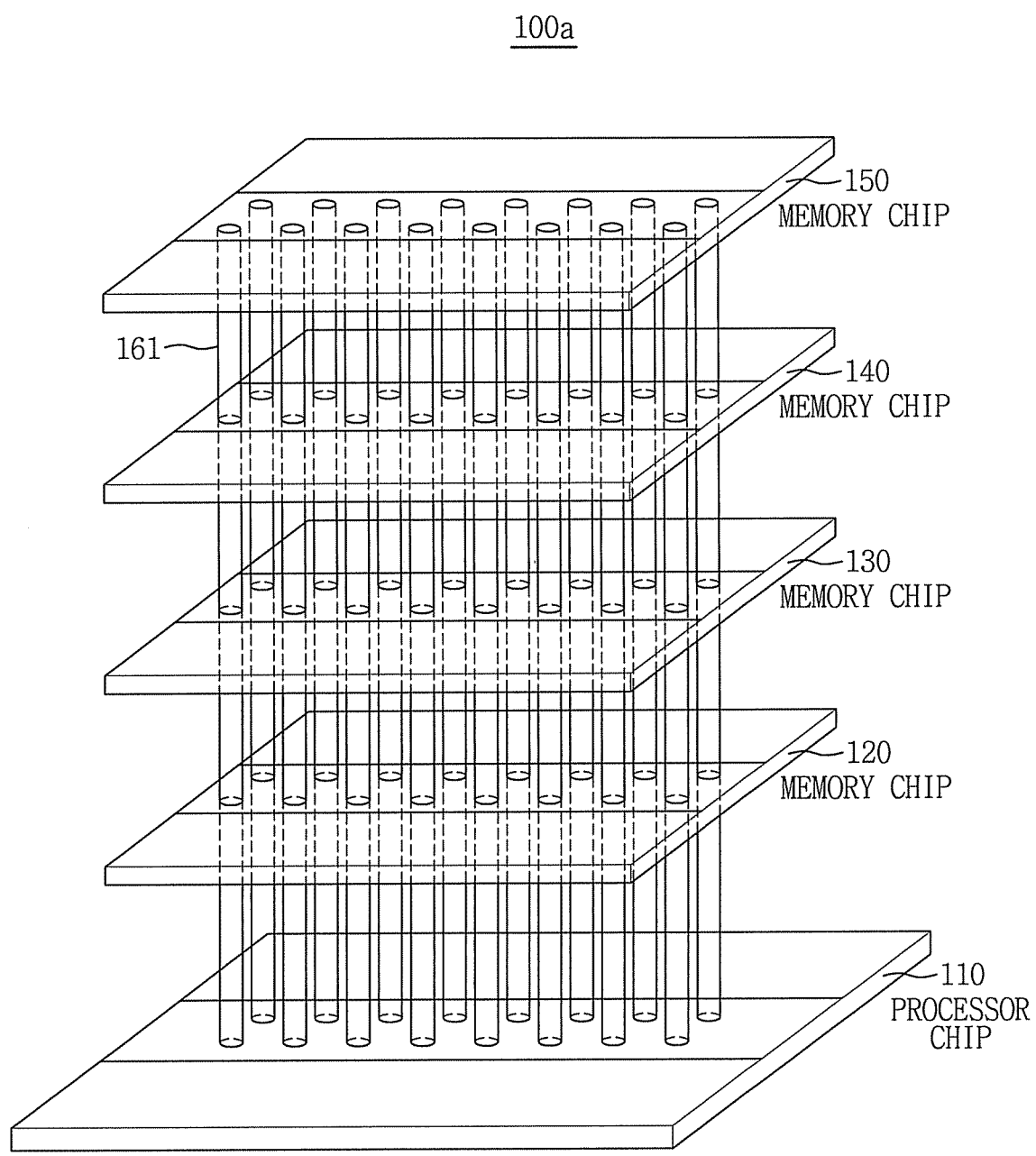
FIG. 3 is a schematic perspective view showing a three-dimensional structure of the memory system of FIG. 1.

FIG. 3 is a schematic perspective view showing a three-dimensional structure of the memory system of FIG. 1.

Referring to FIG. 3, a memory system 100a includes the processor chip and the memory chips 120, 130, 140, and 150 electrically connected by the TSVs 161. Although TSVs 161 arranged in two rows are shown in FIG. 3, it should be understood that the memory system 100a may have other suitable configurations of TSVs.

Figure 4:
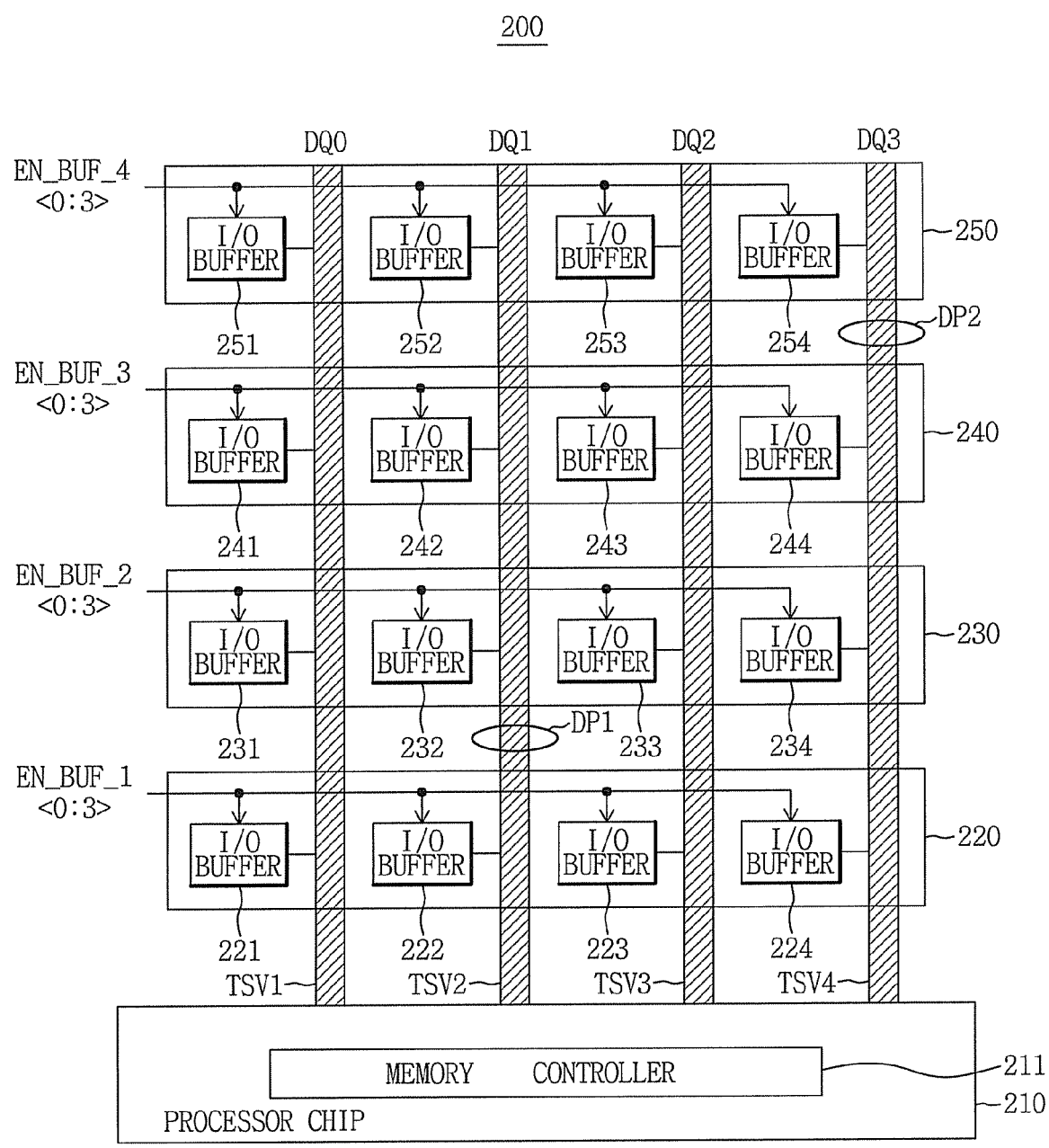
FIG. 4 is a cross-sectional view showing a memory system including a stacked semiconductor memory device in accordance with a second embodiment of the inventive concepts.

FIG. 4 is a cross-sectional view showing a memory system 200 including a stacked semiconductor memory device in accordance with a second embodiment of the inventive concepts.

Referring to FIG. 4, the memory system 200 includes a processor chip 210 and a semiconductor memory device including memory chips 220, 230, 240, and 250 stacked above the processor chip 210. The processor chip 210 may include a memory controller 211.

The $1^{st}$ memory chip 220 is stacked above the processor chip 210, the $2^{nd}$ memory chip 230 is stacked above the $1^{st}$ memory chip 220, the $3^{rd}$ memory chip 240 is stacked above the $2^{nd}$ memory chip 230, and the $4^{th}$ memory chip 250 is stacked above the $3^{rd}$ memory chip 240. TSVs TSV1, TSV2, TSV3, and TSV4 pass through from the $4^{th}$ memory chip 250 to the $1^{st}$ memory chip 220, and are connected to the processor chip 210.

$1^{st}$ to $4^{th}$ buffers 221, 222, 223, and 224 are included in the $1^{st}$ memory chip 220, respectively connected to the $1^{st}$ to $4^{th}$ TSVs TSV1, TSV2, TSV3, and TSV4, and selectively activated by a $1^{st}$ buffer enable signal EN_BUF_1<0:3> as a 4-bit signal.

$5^{th}$ to $8^{th}$ I/O buffers 231, 232, 233, and 234 are included in the $2^{nd}$ memory chip 230, respectively connected to the $1^{st}$ to $4^{th}$ TSVs TSV1, TSV2, TSV3, and TSV4, and selectively activated by a $2^{nd}$ buffer enable signal EN_BUF_2<0:3> as a 4-bit signal.

$9^{th}$ to $12^{th}$ buffers 241, 242, 243, and 244 are included in the $3^{rd}$ memory chip 240, respectively connected to the $1^{st}$ to $4^{th}$ TSVs TSV1, TSV2, TSV3, and TSV4, and selectively activated by a $3^{rd}$ buffer enable signal EN_BUF_3<0:3> as a 4-bit signal.

$13^{th}$ to $16^{th}$ buffers 251, 252, 253, and 254 are included in the $4^{th}$ memory chip 250, respectively connected to the $1^{st}$ to $4^{th}$ TSVs TSV1, TSV2, TSV3, and TSV4, and selectively activated by a $4^{th}$ buffer enable signal EN_BUF_4<0:3> as a 4-bit signal.

The memory system of FIG. 4 has a defect such as an open state in a point DP1 of the $2^{nd}$ TSV TSV2 and has a defect in a point DP2 of the $4^{th}$ TSV TSV4. Communication is possible between DP1 of the $2^{nd}$ TSV TSV2 and the processor chip 210. Accordingly, the $2^{nd}$ I/O buffer 222 included in the $1^{st}$ memory chip 220 located just below the defective point DP1 is activated among the I/O buffers 222, 232, 242, and 252 connected to the $2^{nd}$ TSV TSV2 having the defect. Also, communication is possible between DP2 of the $4^{th}$ TSV TSV4 and the processor chip 210. Accordingly, the $12^{th}$ I/O buffer 244 included in the $3^{rd}$ memory chip 240 located just below the defective point DP2 is activated among the I/O buffers 224, 234, 244, and 254 connected to the $4^{th}$ TSV TSV4 having the defect.

Since the $2^{nd}$ I/O buffer 222 included in the 1st memory chip 220 is already activated, the $5^{th}$ I/O buffer 231 included in the $2^{nd}$ memory chip 230 is activated among the I/O buffers 221, 231, 241, and 251 connected to the $1^{st}$ TSV TSV1. Also, since the $12^{th}$ I/O buffer 244 included in the $3^{rd}$ memory chip 240 is already activated, the $15^{th}$ I/O buffer 253 included in the 4th memory chip 250 is activated among the I/O buffers 223, 233, 243, and 253 connected to the 3rd TSV TSV3.

Figure 5:
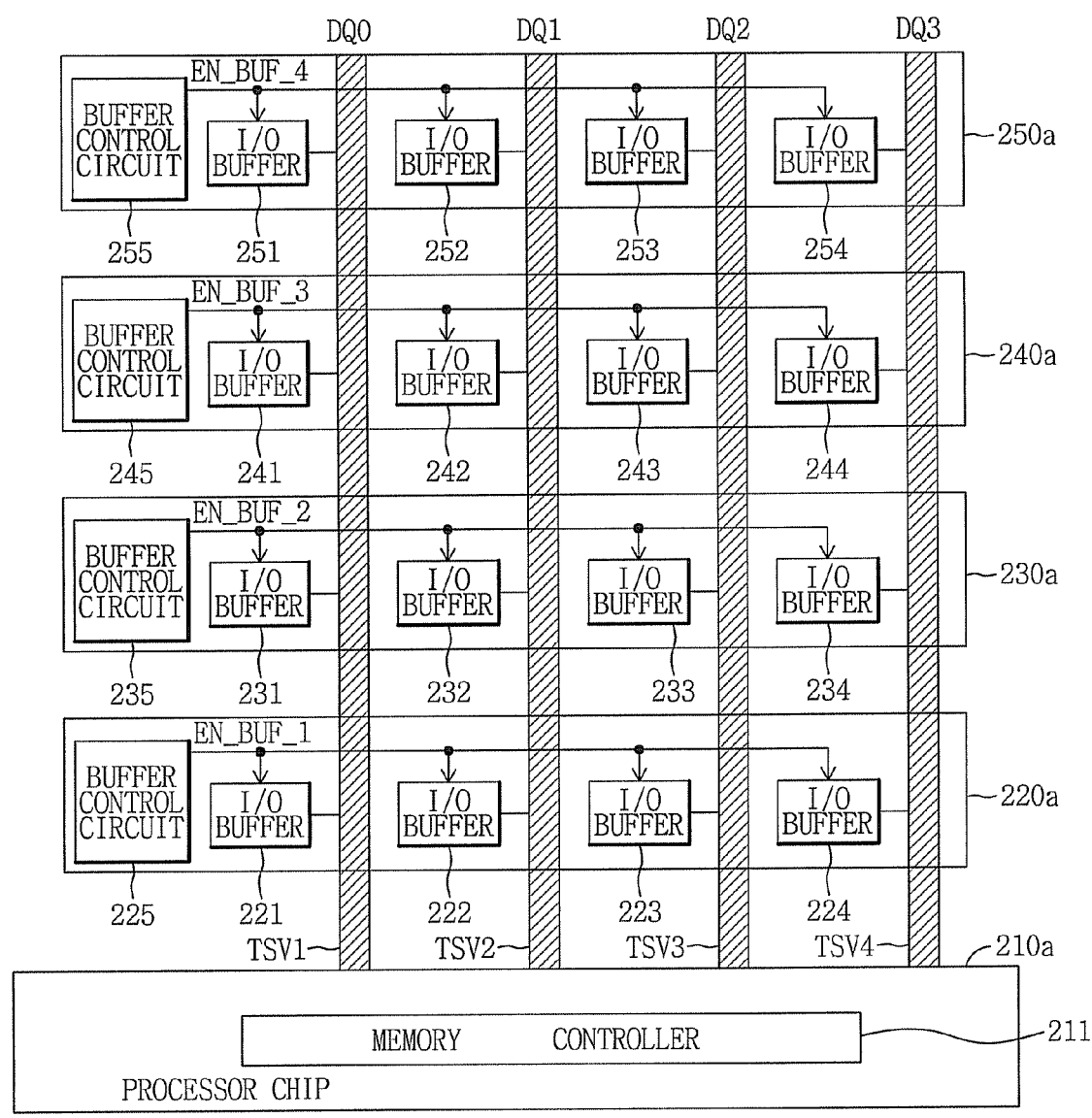
FIG. 5 is a cross-sectional view showing a memory system including a stacked semiconductor memory device in accordance with a third embodiment of the inventive concepts.

FIG. 5 is a cross-sectional view showing a memory system including a stacked semiconductor memory device in accordance with a third embodiment of the inventive concepts.

Referring to FIG. 5, a memory system 200a includes a processor chip 210a and a stacked semiconductor memory device including memory chips 220a, 230a, 240a, and 250a stacked above the processor chip 210a. The processor chip 210a may include a memory controller 211. TSVs TSV1, TSV2, TSV3, and TSV4 pass through from the 4th memory chip 250a to the 1st memory chip 220a, and are connected to the processor chip 210a.

In the stacked semiconductor memory device of FIG. 5 and the memory system including the stacked semiconductor memory device, a buffer control circuit is included inside each of the memory chips 220a, 230a, 240a, and 250a. A 1st buffer control circuit 225 included in the 1st memory chip 220a generates a 1st buffer enable signal EN_BUF_1, and activates or deactivates I/O buffers 221, 222, 223, and 224 included in the 1st memory chip 220a. A 2nd buffer control circuit 235 included in the 2nd memory chip 230a generates a 2nd buffer enable signal EN_BUF_2, and activates or deactivates I/O buffers 231, 232, 233, and 234 included in the 2nd memory chip 230a. A 3rd buffer control circuit 245 included in the 3rd memory chip 240a generates a 3rd buffer enable signal EN_BUF_3, and activates or deactivates I/O buffers 241, 242, 243, and 244 included in the 3rd memory chip 240a. A 4th buffer control circuit 255 included in the 4th memory chip 250a generates a 4th buffer enable signal EN_BUF_4, and activates or deactivates I/O buffers 251, 252, 253, and 254 included in the 4th memory chip 250a.

Figure 6:
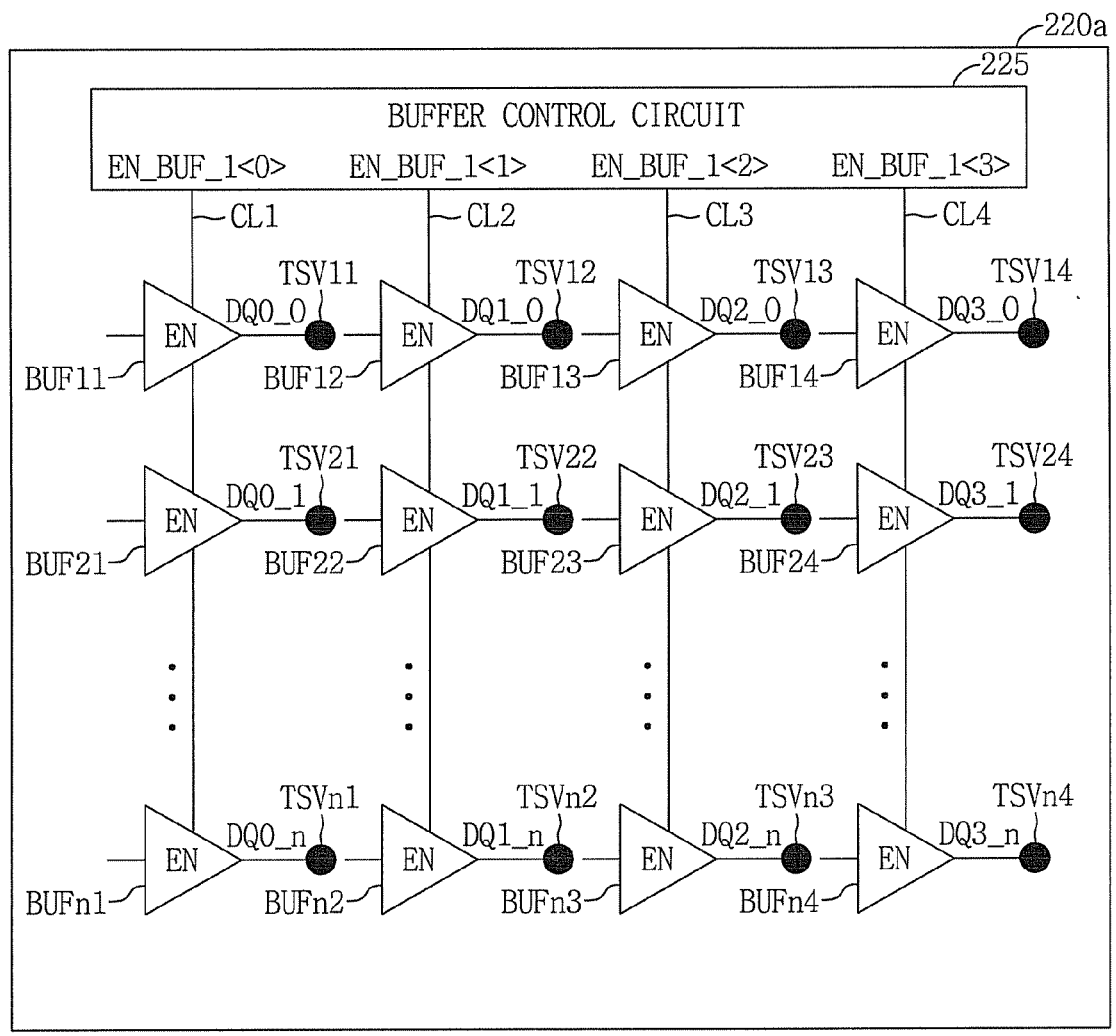
FIG. 6 is a schematic circuit diagram showing an example of a structure of one chip constituting the stacked semiconductor memory device shown in FIG. 5.

FIG. 6 is a schematic circuit diagram showing an example of a structure of one chip constituting the stacked semiconductor memory device shown in FIG. 5.

Referring to FIG. 6, a buffer control circuit 225 of the 1st memory chip 220a is connected to I/O buffers BUF11, BUF21, ..., BUFn1 through a 1st connection line CL1. The I/O buffers BUF11, BUF21, ..., BUFn1 are respectively connected to TSVs TSV11, TSV21, ..., TSVn1. The buffer control circuit 225 is connected to I/O buffers BUF12, BUF22, ..., BUFn2 through a 2nd connection line CL2. The I/O buffers BUF12, BUF22, ..., BUFn2 are respectively connected to TSVs TSV12, TSV22, ..., TSVn2. The buffer control circuit 225 is connected to I/O buffers BUF13, BUF23, ..., BUFn3 through a 3rd connection line CL3. The I/O buffers BUF13, BUF23, ..., BUFn3 are respectively connected to TSVs TSV13, TSV23, ..., TSVn3. The buffer control circuit 225 is connected to I/O buffers BUF14, BUF24, ..., BUFn4 through a 4th connection line CL4. The I/O buffers BUF14, BUF24, ..., BUFn4 are respectively connected to TSVs TSV14, TSV24, ..., TSVn4.

The buffers BUF11, BUF21, ..., BUFn1 output data DQ0_0, DQ0_1, ..., DQ0_n through the TSVs TSV11, TSV21, ..., TSVn1. The I/O buffers BUF12, BUF22, ..., BUFn2 output data DQ1_0, DQ1_1, ..., DQ1_n through the TSVs TSV12, TSV22, ..., TSVn2. The I/O buffers BUF13, BUF23, ..., BUFn3 output data DQ2_0, DQ2_1, ..., DQ2_n through the TSVs TSV13, TSV23, ..., TSVn3. The I/O buffers BUF14, BUF24, ..., BUFn4 output data DQ3_0, DQ3_1, ..., DQ3_n through the TSVs TSV14, TSV24, ..., TSVn4.

The buffer control circuit 225 generates a 4-bit 1st buffer enable signal ENBUF_1<0:3>. A 1st bit ENBUF_1<0> of the 1st buffer enable signal ENBUF_1<0:3> activates the I/O buffers BUF11, BUF21, ..., BUFn1 through the 1st connection line CL1. A 2nd bit ENBUF_1<1> of the 1st buffer enable signal EN_BUF_1<0:3> activates the I/O buffers BUF12, BUF22, ..., BUFn2 through the 2nd connection line CL2. A 3rd bit EN_BUF_1<2> of the 1st buffer enable signal EN_BUF_1<0:3> activates the I/O buffers BUF13, BUF23, ..., BUFn3 through the 3rd connection line CL3. A 4th bit ENBUF_1<3> of the 1st buffer enable signal EN_BUF_1<0:3> activates the I/O buffers BUF14, BUF24, ..., BUFn4 through the 4th connection line CL4.

Figure 7:
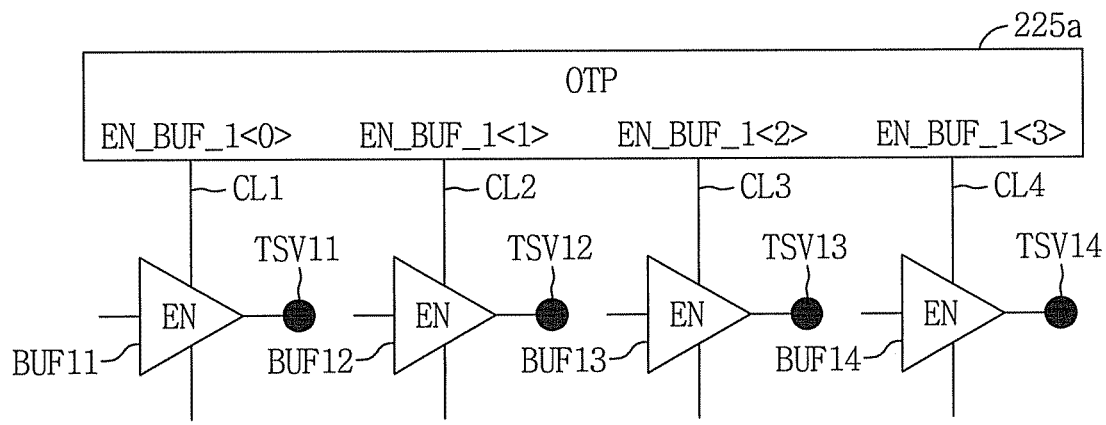
FIG. 7 is a circuit diagram showing a non-limiting embodiment of a buffer control circuit included in the circuit diagram of FIG. 6.
Figure 8:
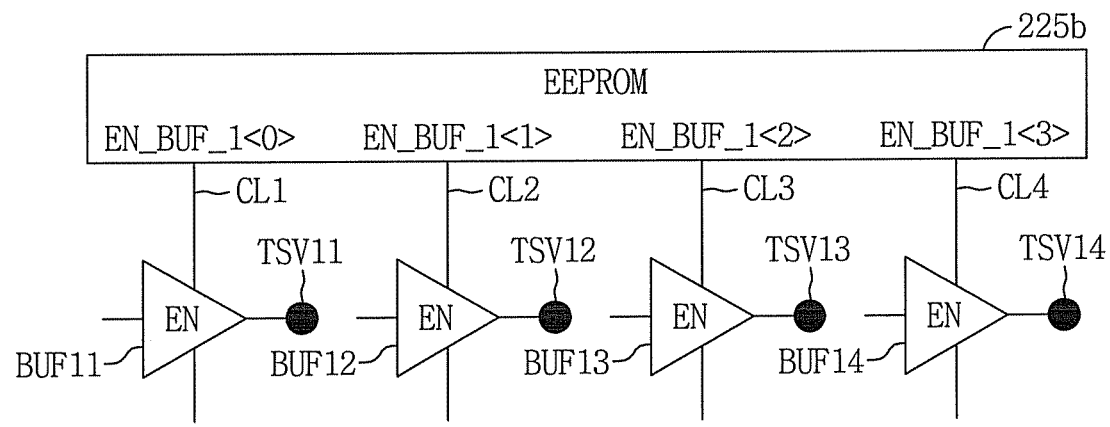
FIG. 8 is a circuit diagram showing another non-limiting embodiment of the buffer control circuit included in the circuit diagram of FIG. 6.

FIGS. 7 and 8 are circuit diagrams showing non-limiting embodiments of the buffer control circuits included in the circuit diagram of FIG. 6.

Referring to FIG. 7, the buffer control circuit 225a may be implemented using one time programming (OTP). Alternatively, referring to FIG. 8, the buffer control circuit 225b may be implemented using an electrically erasable programmable read only memory (EEPROM).

Figure 9:
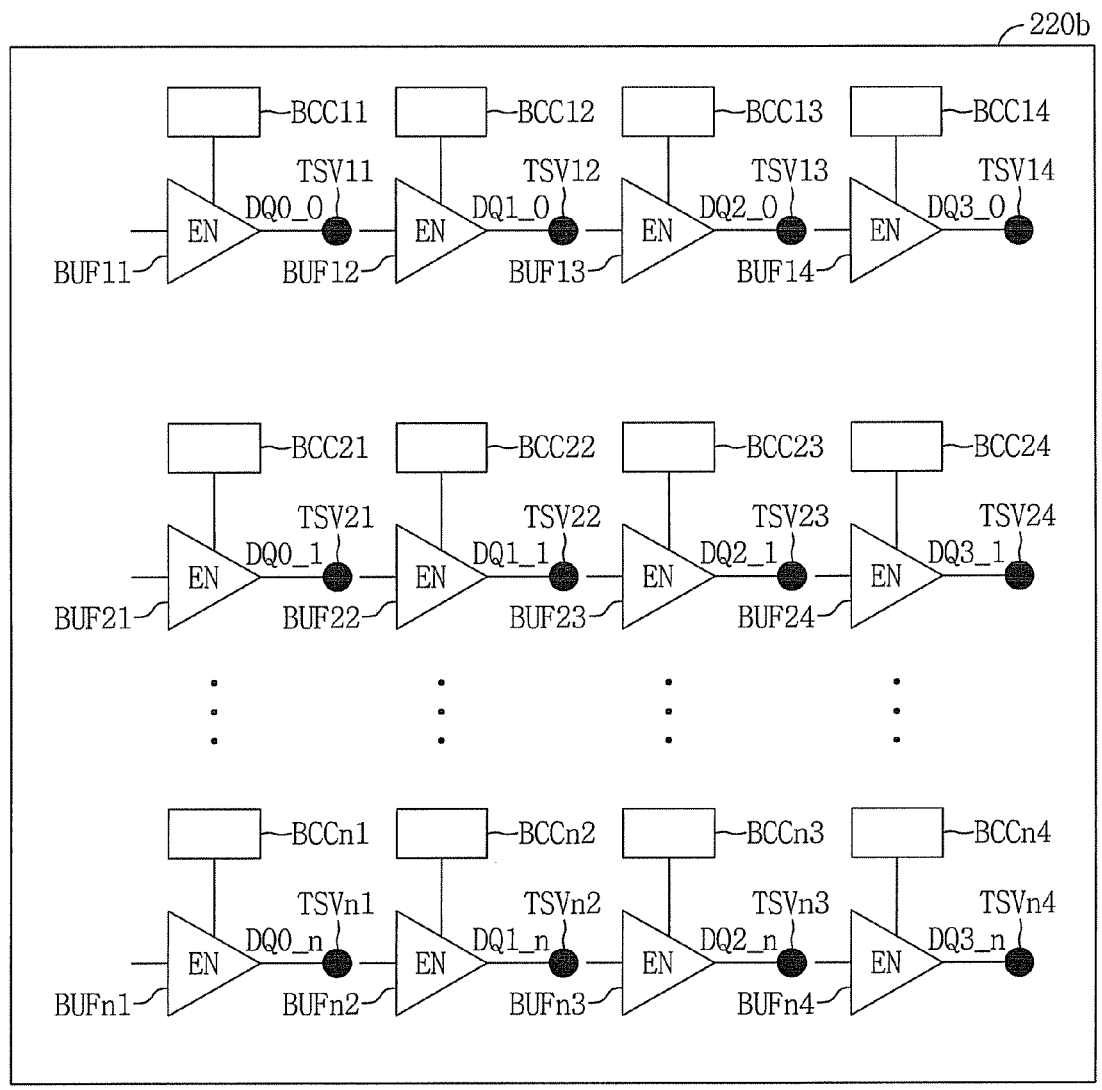
FIG. 9 is a schematic circuit diagram showing another example of a structure of one chip constituting the stacked semiconductor memory device shown in FIG. 5.

FIG. 9 is a schematic circuit diagram showing another example of a structure of one chip constituting the stacked semiconductor memory device shown in FIG. 5.

Referring to FIG. 9, a memory chip 220b independently includes a buffer control circuit for each I/O buffer. For example, the buffer BUF11 is controlled by a buffer control circuit BCC11, the I/O buffer BUF12 is controlled by a buffer control circuit BCC12, the I/O buffer BUF13 is controlled by a buffer control circuit BCC13, and the I/O buffer BUF14 is controlled by a buffer control circuit BCC14. Similarly, the buffer BUF21 is controlled by a buffer control circuit BCC21, the buffer BUF22 is controlled by a buffer control circuit BCC22, the I/O buffer BUF23 is controlled by a buffer control circuit BCC23, and the I/O buffer BUF24 is controlled by a buffer control circuit BCC24. Likewise, the I/O buffer BUFn1 is controlled by a buffer control circuit BCCn1, the I/O buffer BUFn2 is controlled by a buffer control circuit BCCn2, the I/O buffer BUFn3 is controlled by a buffer control circuit BCCn3, and the I/O buffer BUFn4 is controlled by a buffer control circuit BCCn4.

Figure 10:
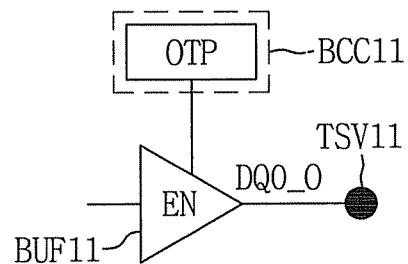
FIG. 10 is a circuit diagram showing an example of a buffer control circuit included in the circuit diagram of FIG. 9.
Figure 11:
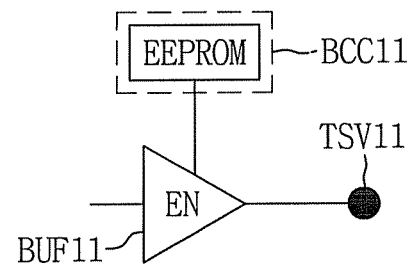
FIG. 11 is a circuit diagram showing another example of the buffer control circuit included in the circuit diagram of FIG. 9.

FIGS. 10 and 11 are circuit diagrams showing non-limiting embodiments of the buffer control circuit included in the circuit diagram of FIG. 9. Referring to FIG. 10, the buffer control circuit BCC11 may be implemented using OTP. Alternatively, referring to FIG. 11, the buffer control circuit BCC11 may be implemented using EEPROM.

Figure 12:
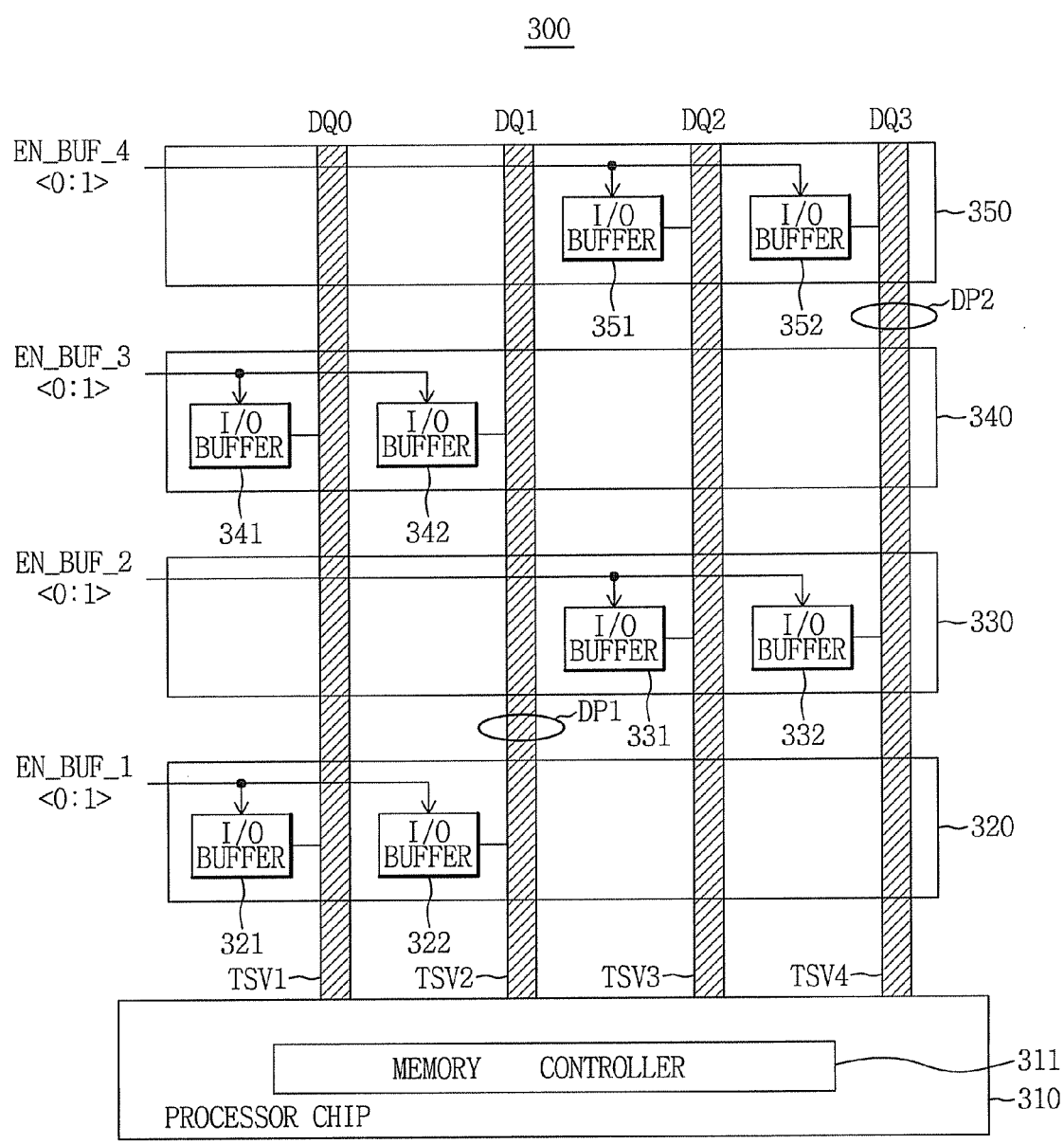
FIG. 12 is a cross-sectional view showing a memory system including a stacked semiconductor memory device in accordance with a fourth embodiment of the inventive concepts.

FIG. 12 is a cross-sectional view showing a memory system 300 including a stacked semiconductor memory device in accordance with a fourth embodiment of the inventive concepts.

Referring to FIG. 12, the memory system 300 includes a processor chip 310 and a stacked semiconductor memory device including memory chips 320, 330, 340, and 350 stacked above the processor chip 310. The processor chip 310 may include a memory controller 311.

The 1st memory chip 320 is stacked above the processor chip 310, the 2nd memory chip 330 is stacked above the 1st memory chip 320, the 3rd memory chip 340 is stacked above the 2" memory chip 330, and the 4th memory chip 350 is stacked above the 3rd memory chip 340. TSVs TSV1, TSV2, TSV3, and TSV4 pass through from the 4th memory chip 350 to the 1st memory chip 320, and are connected to the processor chip 310.

1st and 2nd I/O buffers 321 and 322 are included in the 1st memory chip 320, respectively connected to the 1st and 2nd TSVs TSV1 and TSV2, and selectively activated by a 1st buffer enable signal EN_BUF_1<0:1> as a 2-bit signal.

3rd and 4th buffers 331 and 332 are included in the 2" memory chip 330, respectively connected to the 3rd and 4th TSVs TSV3 and TSV4, and selectively activated by a 2nd buffer enable signal EN_BUF_2<0:1> as a 2-bit signal.

5th and 6th buffers 341 and 342 are included in the 3rd memory chip 340, respectively connected to the 1st and 2nd TSVs TSV1 and TSV2, and selectively activated by a 3rd buffer enable signal EN_BUF_3<0:1> as a 2-bit signal.

7th and 8th I/O buffers 351 and 352 are included in the fourth memory chip 350, respectively connected to the 3rd and 4th TSVs TSV3 and TSV4, and selectively activated by a 4th buffer enable signal EN_BUF_4<0:1> as a 2-bit signal.

Thus, the memory system including the stacked semiconductor memory device of FIG. 12 may differ from the example of FIG. 4. For instance, the memory chips 320, 330, 340, and 350 are not connected to all of the TSVs TSV1, TSV2, TSV3, and TSV4. Instead, each of the memory chips 320, 330, 340, and 350 are connected to two of the TSVs TSV1, TSV2, TSV3, and TSV4, although example embodiments are not limited thereto.

The memory system of FIG. 12 has a defect such as an open state in a point DP1 of the 2nd TSV TSV2 and has a defect in a point DP2 of the 4th TSV TSV4. Communication is possible between DP1 of the 2nd TSV TSV2 and the processor chip 310. Accordingly, the 2nd I/O buffer 322 included in the 1st memory chip 320 located just below the defective point DP1 is activated between the I/O buffers 322 and 342 connected to the 2nd TSV TSV2 having the defect. Also, communication is possible between DP2 of the 4th TSV TSV4 and the processor chip 310. Accordingly, the 4th I/O buffer 332 included in the 2nd memory chip 330 located just below the defective point DP2 is activated between the I/O buffers 332 and 352 connected to the 4th TSV TSV4 having the defect.

Since the 2nd I/O buffer 322 included in the 1st memory chip 320 is already activated, the 5th I/O buffer 341 included in the 3rd memory chip 340 is activated between the I/O buffers 321 and 341 connected to the 1st TSV TSV1. Since the 4th I/O buffer 332 included in the 2nd memory chip 330 is already activated, the 7th I/O buffer 351 included in the 4th memory chip 350 is activated between the I/O buffers 331 and 351 connected to the 3rd TSV TSV3.

Figure 13:
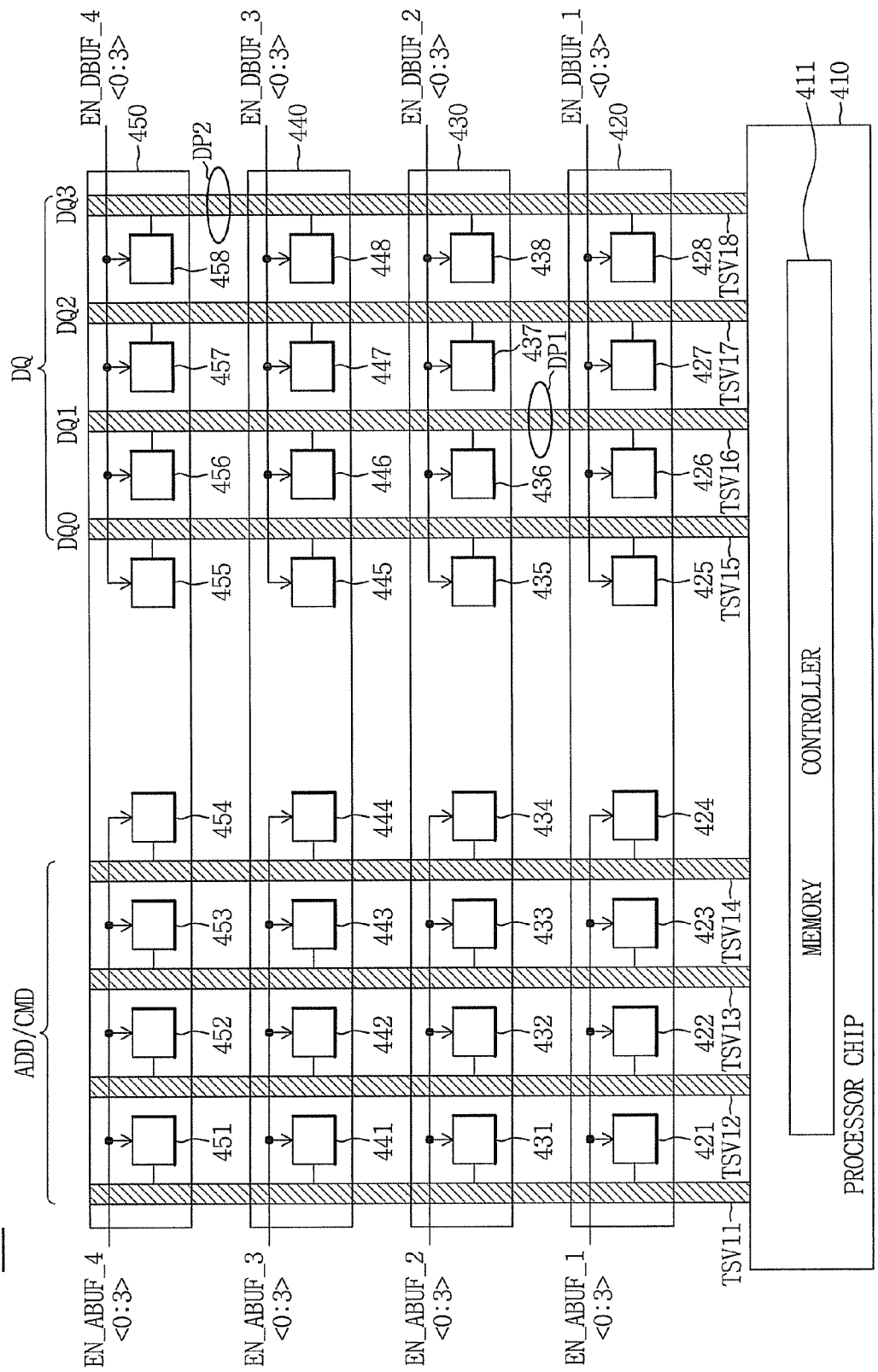
FIG. 13 is a cross-sectional view showing a memory system including a stacked semiconductor memory device in accordance with a fifth embodiment of the inventive concepts.

FIG. 13 is a cross-sectional view showing a memory system 400 including a stacked semiconductor memory device in accordance with a fifth embodiment of the inventive concepts.

Referring to FIG. 13, the memory system 400 includes a processor chip 410 and a stacked semiconductor memory device including memory chips 420, 430, 440, and 450 stacked above the processor chip 410. The processor chip 410 may include a memory controller 411.

The 1st memory chip 420 is stacked above the processor chip 410, the 2nd memory chip 430 is stacked above the 1st memory chip 420, the 3rd memory chip 440 is stacked above the 2nd memory chip 430, and the 4th memory chip 450 is stacked above the 3rd memory chip 440. TSVs TSV11, TSV12, TSV13, TSV14, TSV15, TSV16, TSV17, and TSV18 pass through from the 4th memory chip 450 to the 1st memory chip 420, and are connected to the processor chip 410. The TSVs TSV11, TSV12, TSV13, and TSV14 transfer an address/command ADD/CMD, and the TSVs TSV15, TSV16, TSV17, and TSV18 transfer data DQ.

1st to 4th buffers 421, 422, 423, and 424 are included in the 1st memory chip 420, respectively connected to the 1st to 4th TSVs TSV11, TSV12, TSV13, and TSV14, and selectively activated by a 1st buffer enable signal EN_ABUF_1<0:3> as a 4-bit signal. 5th to 8th I/O buffers 425, 426, 427, 428 are included in the 1st memory chip 420, respectively connected to the 5th to 8th TSVs TSV15, TSV16, TSV17, and TSV18, and selectively activated by a 2nd buffer enable signal EN_DBUF_1<0:3> as a 4-bit signal.

9th to 12th I/O buffers 431, 432, 433, and 434 are included in the 2nd memory chip 430, respectively connected to the 1st to 4th TSVs TSV11, TSV12, TSV13, and TSV14, and selectively activated by a 3rd buffer enable signal EN_ABUF_2<0:3> as a 4-bit signal. 13th to 16th buffers 435, 436, 437, 438 are included in the 2nd memory chip 430, respectively connected to the 5th to 8th TSVs TSV15, TSV16, TSV17, and TSV18, and selectively activated by a 4th buffer enable signal EN_DBUF_2<0:3> as a 4-bit signal.

17th to 20th buffers 441, 442, 443, and 444 are included in the 3rd memory chip 440, respectively connected to the 1st to 4th TSVs TSV11, TSV12, TSV13, and TSV14, and selectively activated by a 5th buffer enable signal EN_ABUF_3<0:3> as a 4-bit signal. 21st to 24th I/O buffers 445, 446, 447, 448 are included in the 3rd memory chip 440, respectively connected to the 5th to 8th TSVs TSV15, TSV16, TSV17, and TSV18, and selectively activated by a 6th buffer enable signal EN_DBUF_3<0:3> as a 4-bit signal.

25th to 28th I/O buffers 451, 452, 453, and 454 are included in the 4th memory chip 450, respectively connected to the 1st to 4th TSVs TSV11, TSV12, TSV13, and TSV14, and selectively activated by a 7th buffer enable signal EN_ABUF_4<0:3> as a 4-bit signal. 29th to 32nd I/O buffers 455, 456, 457, 458 are included in the 4th memory chip 450, respectively connected to the 5th to 8th TSVs TSV15, TSV16, TSV17, and TSV18, and selectively activated by an 8th buffer enable signal EN_DBUF_4<0:3> as a 4-bit signal.

In the embodiment of FIG. 13, the 1st buffer enable signal EN_ABUF_1<0:3>, the 3rd buffer enable signal EN_ABUF_2<0:3>, the 5th buffer enable signal EN_ABUF_3<0:3>, and the 7th buffer enable signal EN_ABUF_4<0:3> control I/O buffers connected to the 1st to 4th TSVs TSV11, TSV12, TSV13, and TSV14 for a command/address. The 2nd buffer enable signal EN_DBUF_1<0:3>, the 4th buffer enable signal EN_DBUF2<0:3>, the 6th buffer enable signal EN_DBUF_3<0:3>, and the 8th buffer enable signal EN_DBUF_4<0:3> control I/O buffers connected to the 5th to 8th TSVs TSV15, TSV16, TSV17, and TSV18 for data.

If the 6th TSV TSV16 is defective in a point DP1 between the 1st memory chip 420 and the 2nd memory chip 430 and the 8th TSV TSV18 is defective in a point DP2 between the 3rd memory chip 440 and the 4th memory chip 450, the 6th I/O buffer 426 of the 1st memory chip 420 connected to the 6th TSV TSV16 is activated and the 24th I/O buffer 448 of the 3rd memory buffer 440 connected to the 8th TSV TSV18 is activated.

Since the 6th I/O buffer 426 included in the 1st memory chip 420 is already activated, the 13th I/O buffer 435 included in the 2nd memory chip 430 is activated among the I/O buffers 425, 435, 445, and 455 connected to the 5th TSV TSV15. Also, since the 24th I/O buffer 448 included in the 3rd memory chip 440 is already activated, the 31st I/O buffer 457 included in the 4th memory chip 450 is activated among the I/O buffers 427, 437, 447, and 457 connected to the 7th TSV TSV17.

If data mapping is changed because of defective TSVs, address/command (ADD/CMD) mapping is also changed according to the changed data mapping. Among I/O buffers connected to TSVs for data in the example of FIG. 13, the 13th buffer 435 connected to the 5th TSV TSV15 is activated, the 6th I/O buffer 426 connected to the 6th TSV TSV16 is activated, the 31st I/O buffer 457 connected to the 7th TSV TSV17 is activated, and the 24th buffer 448 connected to the 8th TSV TSV18 is activated. Accordingly, among I/O buffers connected to TSVs for an address/command (ADD/CMD), the 9th I/O buffer 431 connected to the 1st TSV TSV11 may be activated, the 2nd I/O buffer 422 connected to the 12nd TSV TSV12 may be activated, the 27th I/O buffer 453 connected to the 3rd TSV TSV13 may be activated, and the 20th I/O buffer 444 connected to the 4th TSV TSV14 may be activated.

Figure 14:
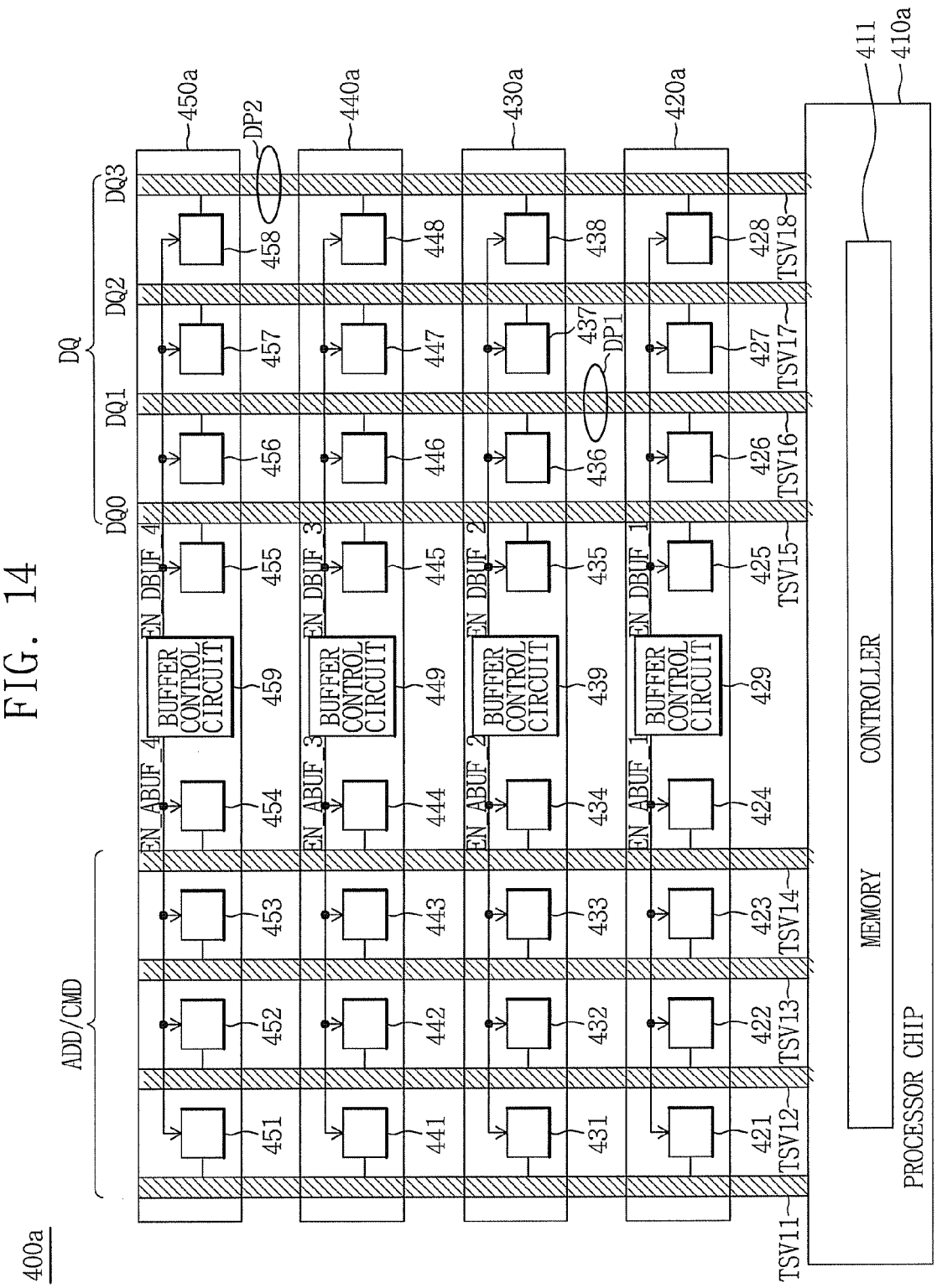
FIG. 14 is a cross-sectional view showing a memory system including a stacked semiconductor memory device in accordance with a sixth embodiment of the inventive concepts.

FIG. 14 is a cross-sectional view showing a memory system 400a including a stacked semiconductor memory device in accordance with a sixth embodiment of the inventive concepts.

In the memory system 400a of FIG. 14, buffer control circuits 429, 439, 449, and 459 for generating buffer enable signals are respectively built in memory chips 420a, 430a, 440a, and 450a. The processor chip 410a of FIG. 14 may be as described in connection with the processor chip 410 of FIG. 13. Since the operation of the memory system 400a of FIG. 14 is similar to that of the memory system 400 shown in FIG. 13, the description of the operation of the memory system 400a of FIG. 14 has been omitted for purposes of brevity.

Figure 15:
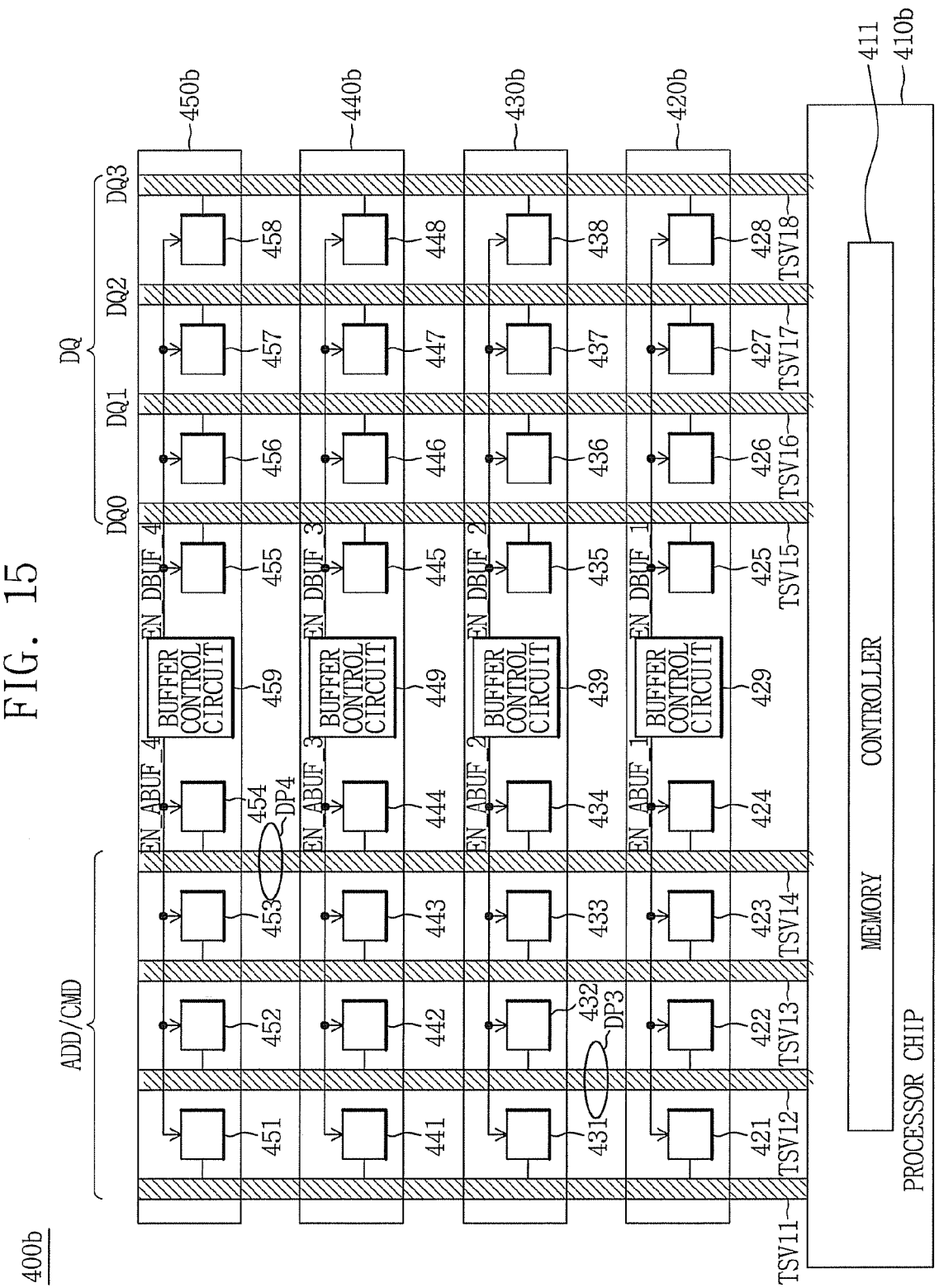
FIG. 15 is a cross-sectional view showing a memory system including a stacked semiconductor memory device in accordance with a seventh embodiment of the inventive concepts.

FIG. 15 is a cross-sectional view showing a memory system 400b including a stacked semiconductor memory device in accordance with a seventh embodiment of the inventive concepts.

The processor chip 410b of FIG. 15 may be as described in connection with the processor chip 410 of FIG. 13. Also, the memory chips 420b, 430b, 440b, and 450b may be as described in connection with the memory chips 420, 430, 440, and 450 of FIG. 13. Referring to FIG. 15, if TSVs for an address/command (ADD/CMD) are defective in the memory system 400b, then the data mapping is changed.

The memory system 400b of FIG. 15 is defective in a point DP3 of a 2nd TSV TSV12 and a point DP4 of a 4th TSV TSV14. Among the I/O buffers connected to the TSVs for the address/command (ADD/CMD), a 9th I/O buffer 431 connected to a 1st TSV TSV11 is activated, a 2nd I/O buffer 422 connected to a 2nd TSV TSV12 is activated, a 27th I/O buffer 453 connected to a 3rd TSV TSV13 is activated, and a 20th I/O buffer 444 connected to a 4th TSV TSV14 is activated. Accordingly, among I/O buffers connected to TSVs for data, a 13th I/O buffer 435 connected to a 5th TSV TSV15 may be activated, a 6th I/O buffer 426 connected to a 6th TSV TSV16 may be activated, a 31st I/O buffer 457 connected to a 7th TSV TSV17 may be activated, and a 24th I/O buffer 448 connected to an 8th TSV TSV18 may be activated.

If data mapping of the stacked semiconductor memory device is changed, then the processor chip 410b should recover the changed data bus mapping to the original.

Figure 16:
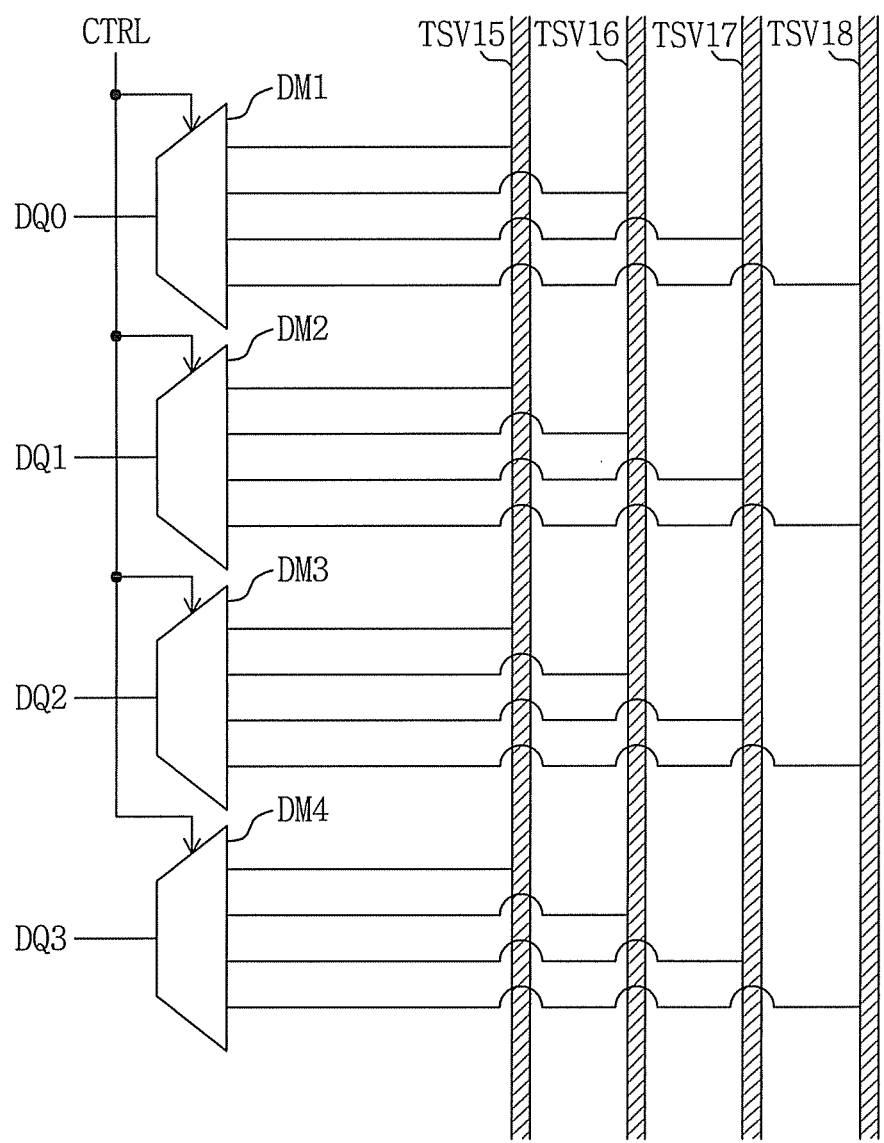
FIG. 16 is a circuit diagram showing a repair circuit for recovering changed data mapping to the original in the memory systems of FIGS. 13, 14, and 15.

FIG. 16 is a circuit diagram showing a repair circuit 412 for recovering changed data mapping to the original in the memory systems of FIGS. 13, 14, and 15.

Referring to FIG. 16, the repair circuit 412 includes demultiplexers DM1, DM2, DM3, and DM4 connected to TSVs TSV15, TSV16, TSV17, and TSV18. In response to a control signal CTRL, the repair circuit 412 provides data DQ0, DQ1, DQ2, and DQ3 to one of TSVs TSV15, TSV16, TSV17, and TSV18. The control signal CTRL may be obtained on the basis of a mapping table, and may be obtained by the processor chip 410 performing a training operation on memory chips.

Figure 17:
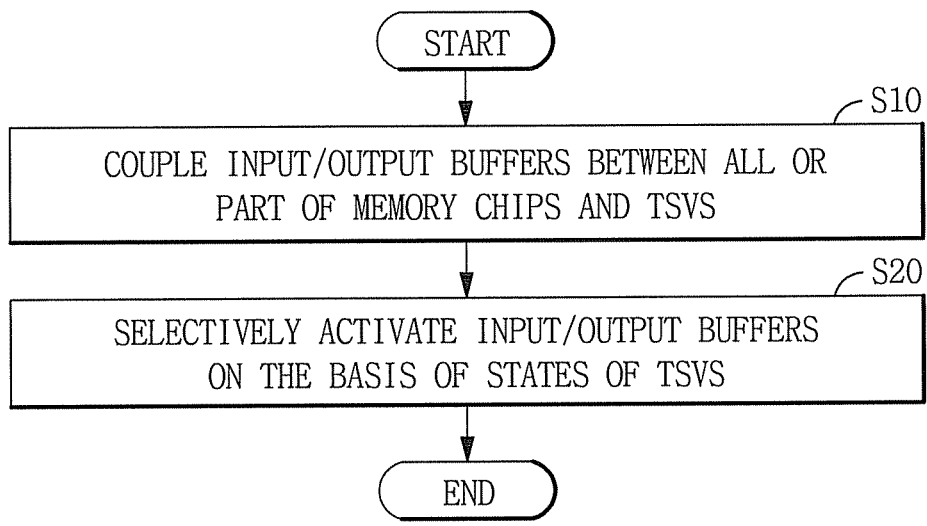
FIG. 17 is a flowchart showing a method of TSV defect repair in a stacked semiconductor memory device in accordance with embodiments of the inventive concepts.

FIG. 17 is a flowchart showing a method of TSV defect repair in a stacked semiconductor memory device in accordance with example embodiments of the inventive concepts.

Referring to FIG. 17, it is possible to repair a TSV defect of the stacked semiconductor memory device through the following steps.

In step S10, I/O buffers are coupled between all or part of memory chips and TSVs.

In step S20, the I/O buffers are selectively activated on the basis of states of the TSVs.

Figure 18:
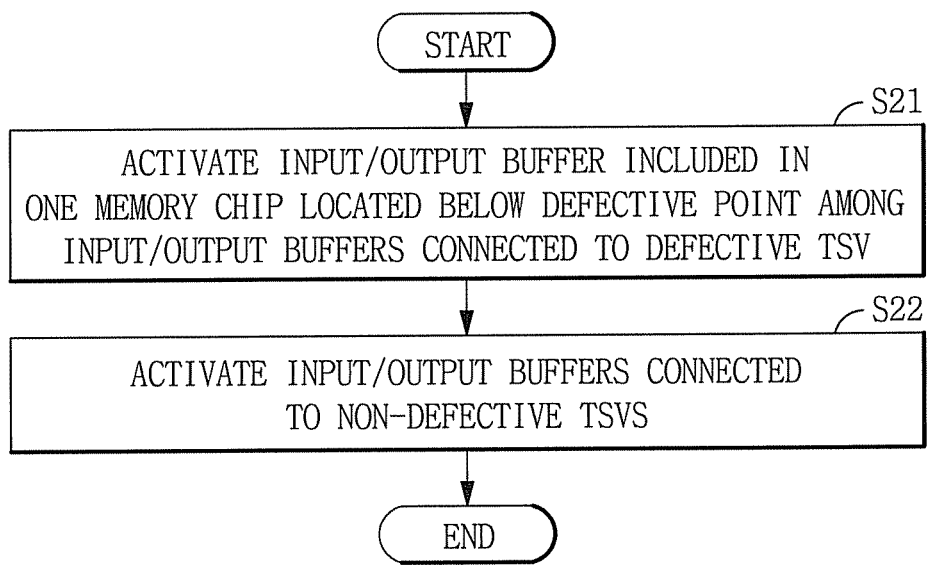
FIG. 18 is a flowchart showing an example of the step of selectively activating I/O buffers in the method of TSV defect repair of FIG. 17.

FIG. 18 is a flowchart showing an example of the step of selectively activating the I/O buffers in the method of TSV defect repair of FIG. 17.

Referring to FIG. 18, the step of selectively activating the I/O buffers may include the following steps.

In step S21, an I/O buffer included in one memory chip located below a defective point is activated among I/O buffers connected to a defective TSV.

In step S22, I/O buffers connected to non-defective TSVs are activated.

Figure 19:
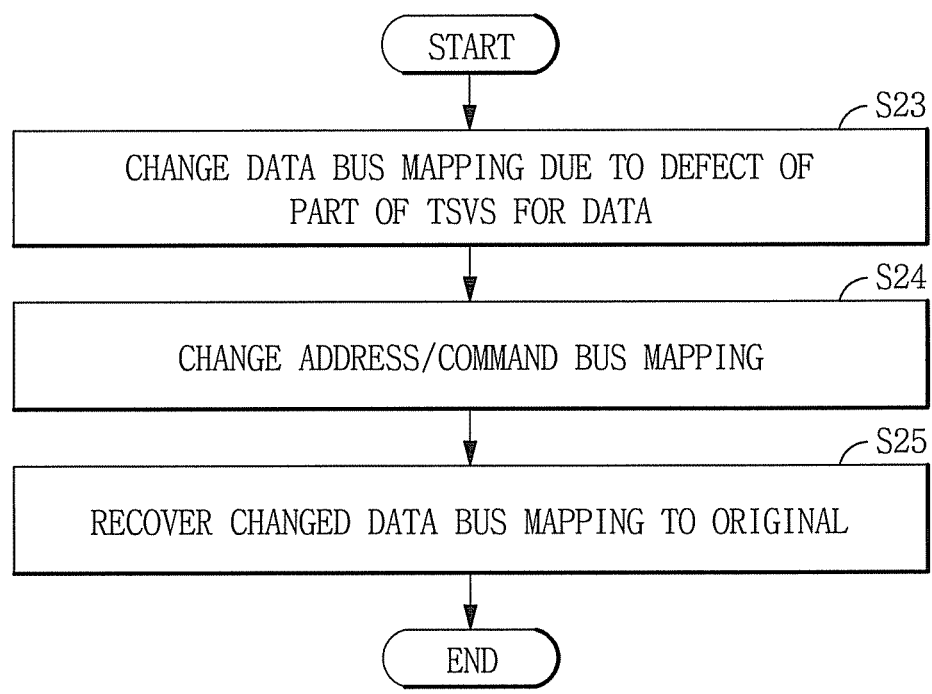
FIG. 19 is a flowchart showing another example of the step of selectively activating I/O buffers in the method of TSV defect repair of FIG. 17.

FIG. 19 is a flowchart showing another example of the step of selectively activating the I/O buffers in the method of TSV defect repair of FIG. 17.

Referring to FIG. 19, the step of selectively activating the I/O buffers may include the following steps.

In step S23, data bus mapping is changed due to a defect of part of TSVs for the data.

In step S24, address/command bus mapping is changed.

In step S25, the changed data bus mapping is recovered to the original.

As discussed herein, a number of embodiments of the inventive concepts may be applied to a memory system including a stacked semiconductor memory device.

In accordance with non-limiting embodiments of the inventive concepts, a stacked semiconductor device selectively activates I/O buffers included in memory chips connected to TSVs on the basis of defective states of TSVs.

In accordance with non-limiting embodiments of the inventive concepts, a stacked semiconductor memory device and a memory system including the same may increase manufacturing yield.

The foregoing is merely illustrative of various embodiments and is not to be construed as limiting thereof. Although a few non-limiting embodiments have been described, those skilled in the art will readily appreciate that many modifications are possible without materially departing from the novel teachings and advantages herein. Accordingly, all such modifications are intended to be included in the scope of the inventive concepts as defined in the claims. In the claims, means-plus-function clauses are intended to cover the structures described herein as performing the recited function, and not only structural equivalents but also equivalent structures. Therefore, it is to be understood that the foregoing is merely illustrative of various embodiments and is not to be construed as limited to the specific embodiments disclosed, and that modifications to the disclosed embodiments, as well as other embodiments, are intended to be included in the scope of the appended claims.

What is claimed is:

1. A stacked semiconductor memory device, comprising:
a plurality of stacked memory chips;
a plurality of through silicon vias (TSVs) passing through the memory chips; and
a plurality of I/O buffers, each I/O buffer coupled between at least one of the memory chips and at least one of the TSVs, the I/O buffers configured to be selectively activated on the basis of defective states of the TSVs.

2. The stacked semiconductor memory device according to claim 1, wherein the I/O buffers are included inside the memory chips.

3. The stacked semiconductor memory device according to claim 1, wherein the I/O buffers are configured such that, when at least one of the TSVs includes a defective point, an I/O buffer included in a memory chip located below the defective point is activated.

4. The stacked semiconductor memory device according to claim 3, wherein the I/O buffers are configured such that, when at least one of the TSVs includes a defective point, an I/O buffer included in a memory chip located above the defective point is not activated.

5. The stacked semiconductor memory device according to claim 1, wherein the I/O buffers are configured such that, when at least one of the TSVs includes a defective point, an I/O buffer included in a memory chip located above the defective point is not activated.

6. The stacked semiconductor memory device according to claim 1, wherein each of the plurality of stacked memory chips includes a buffer control circuit configured to enable I/O buffers inside each of the plurality of stacked memory chips on the basis of the defective states of the TSVs.

7. The stacked semiconductor memory device according to claim 6, wherein the buffer control circuit includes a non-volatile memory device.

8. The stacked semiconductor memory device according to claim 6, wherein the buffer control circuit includes a one time programming (OTP) memory or an electrically erasable programmable read only memory (EEPROM).

9. The stacked semiconductor memory device according to claim 1, wherein each of the plurality of stacked memory chips includes an independent buffer control circuit for each I/O buffer, the buffer control circuit configured to enable I/O buffers on the basis of the defective states of the TSVs.

10. The stacked semiconductor memory device according to claim 1, wherein the plurality of stacked memory chips include:
   a $1^{st}$ memory chip;
   a $2^{nd}$ memory chip stacked above the $1^{st}$ memory chip;
   a $3^{rd}$ memory chip stacked above the $2^{nd}$ memory chip;
   a $4^{th}$ memory chip stacked above the $3^{rd}$ memory chip;
   wherein the plurality of TSVs include $1^{st}$ to $4^{th}$ TSVs, the $1^{st}$ to $4^{th}$ TSVs extending through the $4^{th}$ memory chip to the $1^{st}$ memory chip;
   wherein the I/O buffers include $1^{st}$ to $16^{th}$ I/O buffers;
   the $1^{st}$ to $4^{th}$ I/O buffers included in the $1^{st}$ memory chip, respectively connected to the $1^{st}$ to $4^{th}$ TSVs, and configured to be selectively activated by a $1^{st}$ buffer enable signal;
   the $5^{th}$ to $8^{th}$ I/O buffers included in the $2^{nd}$ memory chip, respectively connected to the $1^{st}$ to $4^{th}$ TSVs, and configured to be selectively activated by a $2^{nd}$ buffer enable signal;
   the $9^{th}$ to $12^{th}$ I/O buffers included in the $3^{rd}$ memory chip, respectively connected to the $1^{st}$ to $4^{th}$ TSVs, and configured to be selectively activated by a $3^{rd}$ buffer enable signal; and
   the $13^{th}$ to $16^{th}$ I/O buffers included in the $4^{th}$ memory chip, respectively connected to the $1^{st}$ to $4^{th}$ TSVs, and configured to be selectively activated by a $4^{th}$ buffer enable signal.

11. The stacked semiconductor memory device according to claim 1, wherein the plurality of stacked memory chips include:
   a $1^{st}$ memory chip;
   a $2^{nd}$ memory chip stacked above the $1^{st}$ memory chip;
   a $3^{rd}$ memory chip stacked above the $2^{nd}$ memory chip;
   a $4^{th}$ memory chip stacked above the $3^{rd}$ memory chip;
   wherein the plurality of TSVs include $1^{st}$ to $4^{th}$ TSVs, the $1^{st}$ to $4^{th}$ TSVs extending through the $4^{th}$ memory chip to the $1^{st}$ memory chip;
   wherein the I/O buffers include $1^{st}$ to $8^{th}$ I/O buffers,
   the $1^{st}$ and $2^{nd}$ I/O buffers included in the $1^{st}$ memory chip, respectively connected to the $1^{st}$ to $2^{nd}$ TSVs, and configured to be selectively activated by a $1^{st}$ buffer enable signal;
   the $3^{rd}$ and $4^{th}$ I/O buffers included in the $2^{nd}$ memory chip, respectively connected to the $3^{rd}$ and $4^{th}$ TSVs, and configured to be selectively activated by a $2^{nd}$ buffer enable signal;
   the $5^{th}$ and $6^{th}$ I/O buffers included in the $3^{rd}$ memory chip, respectively connected to the $1^{st}$ and $2^{nd}$ TSVs, and configured to be selectively activated by a $3^{rd}$ buffer enable signal; and
   the $7^{th}$ and $8^{th}$ I/O buffers included in the $4^{th}$ memory chip, respectively connected to the $3^{rd}$ and $4^{th}$ TSVs, and configured to be selectively activated by a $4^{th}$ buffer enable signal.

12. The stacked semiconductor memory device according to claim 1, wherein the plurality of TSVs include address/command TSVs and data TSVs configured such that a data bus mapping change due to a defect of at least one of the data TSVs results in an address/command bus mapping change.

13. The stacked semiconductor memory device according to claim 1, wherein the plurality of stacked memory chips include:
   a $1^{st}$ memory chip;
   a $2^{nd}$ memory chip stacked above the $1^{st}$ memory chip;
   a $3^{rd}$ memory chip stacked above the $2^{nd}$ memory chip;
   a $4^{th}$ memory chip stacked above the $3^{rd}$ memory chip;
   wherein the plurality of TSVs include $1^{st}$ to $8^{th}$ TSVs,
   the $1^{st}$ to $4^{th}$ TSVs extending through the $4^{th}$ memory chip to the $1^{st}$ memory chip;
   the $5^{th}$ to $8^{th}$ TSVs extending through the $4^{th}$ memory chip to the $1^{st}$ memory chip;
   wherein the I/O buffers includes $1^{st}$ to $32^{nd}$ I/O buffers,
   the $1^{st}$ to $4^{th}$ I/O buffers included in the $1^{st}$ memory chip, respectively connected to the $1^{st}$ to $4^{th}$ TSVs, and configured to be selectively activated by a $1^{st}$ buffer enable signal;
   the $5^{th}$ to $8^{th}$ I/O buffers included in the $1^{st}$ memory chip, respectively connected to the $5^{th}$ to $8^{th}$ TSVs, and configured to be selectively activated by a $2^{nd}$ buffer enable signal;
   the $9^{th}$ to $12^{th}$ I/O buffers included in the $2^{nd}$ memory chip, respectively connected to the $1^{st}$ to $4^{th}$ TSVs, and configured to be selectively activated by a $3^{rd}$ buffer enable signal;
   the $13^{th}$ to $16^{th}$ I/O buffers included in the $2^{nd}$ memory chip, respectively connected to the $5^{th}$ to $8^{th}$ TSVs, and configured to be selectively activated by a $4^{th}$ buffer enable signal;
   the $17^{th}$ to $20^{th}$ I/O buffers included in the $3^{rd}$ memory chip, respectively connected to the $1^{st}$ to $4^{th}$ TSVs, and configured to be selectively activated by a $5^{th}$ buffer enable signal;
   the $21^{st}$ to $24^{th}$ I/O buffers included in the $3^{rd}$ memory chip, respectively connected to the $5^{th}$ to $8^{th}$ TSVs, and configured to be selectively activated by a $6^{th}$ buffer enable signal;
   the $25^{th}$ to $28^{th}$ I/O buffers included in the $4^{th}$ memory chip, respectively connected to the $1^{st}$ to $4^{th}$ TSVs, and configured to be selectively activated by a $7^{th}$ buffer enable signal; and
   the $29^{th}$ to $32^{nd}$ I/O buffers included in the $4^{th}$ memory chip, respectively connected to the $5^{th}$ to $8^{th}$ TSVs, and configured to be selectively activated by an $8^{th}$ buffer enable signal.

14. The stacked semiconductor memory device according to claim 13, wherein the I/O buffers are configured such that, when a portion of the $6^{th}$ TSV between the $1^{st}$ memory chip and the $2^{nd}$ memory chip is defective and a portion of the $8^{th}$ TSV between the $3^{rd}$ memory chip and the $4^{th}$ memory chip is defective, the 6th I/O buffer of the 1st memory chip connected to the 6th TSV is activated and the 24th I/O buffer of the 3rd memory chip connected to the 8th TSV is activated.

15. The stacked semiconductor memory device according to claim 14, wherein the I/O buffers are configured such that the 2nd I/O buffer of the 1st memory chip connected to the 2nd TSV for the address/command is also activated, and the 20th I/O buffer of the 3rd memory chip connected to the 4th TSV for the address/command is also activated.

16. The stacked semiconductor memory device according to claim 1, wherein the plurality of TSVs include address/command TSVs and data TSVs configured such that an address/command bus mapping change due to a defect of at least one of the address/command TSVs results in a data bus mapping change.

17. A memory system comprising:
a processor chip;
a plurality of memory chips stacked above the processor chip;
a plurality of through silicon vias (TSVs) extending through the plurality of memory chips and connected to the processor chip; and
a plurality of I/O buffers, each I/O buffer coupled between at least one the plurality of memory chips and at least one of the plurality of TSVs and configured to be selectively activated on the basis of defective states of the plurality of TSVs.

18. The memory system according to claim 17, wherein the plurality of TSVs include address/command TSVs and data TSVs configured such that a data bus mapping change due to a defect of at least one of the data TSVs results in an address/command bus mapping change.

19. The memory system according to claim 18, wherein the processor chip includes a repair circuit configured to recover the data bus mapping change to an original data bus mapping.

20. The memory system according to claim 19, wherein the repair circuit is included in a memory controller inside the processor chip.

21. A method of repairing defects of through silicon vias (TSVs) in a stacked semiconductor memory device, comprising:
coupling each of a plurality of I/O buffers between at least one of a plurality of memory chips and at least one of a plurality of TSVs; and
selectively activating the I/O buffers based on defective states of the TSVs.

22. The method according to claim 21, wherein the I/O buffers are formed inside the memory chips.

23. The method according to claim 21, wherein selectively activating the I/O buffers includes:
activating an I/O buffer included in one memory chip located below a defective point of a defective TSV while not activating other I/O buffers connected to the defective TSV; and
activating I/O buffers connected to non-defective TSVs.

24. The method according to claim 21, wherein selectively activating the I/O buffers includes:
when a TSV has a defective point and I/O buffers are connected to the TSV with the defective point, I/O buffers included in a memory chip located above the defective point are not activated.

25. The method according to claim 21, wherein selectively activating the I/O buffers includes:
changing data bus mapping due to a defect of at least one of TSVs for data; and
changing address/command bus mapping.

26. The method according to claim 25, wherein selectively activating the I/O buffers further includes:
recovering the changed data bus mapping to an original data bus mapping.

27. A stacked semiconductor memory device, comprising:
a plurality of memory chips stacked in a first direction;
a plurality of I/O buffers disposed in each of the plurality of memory chips; and
a plurality of through silicon vias (TSVs) extending in the first direction through the plurality of memory chips, each of the plurality of TSVs being coupled to at least two of the plurality of I/O buffers, the plurality of I/O buffers configured to be selectively activated if a defect is present in one or more of the plurality of TSVs.

28. The stacked semiconductor memory device according to claim 27, wherein an associated I/O buffer is configured to be activated if the defect is present in a defective TSV of the plurality of TSVs, the associated I/O buffer being coupled to the defective TSV and located below the defect.

29. The stacked semiconductor memory device according to claim 28, wherein the associated I/O buffer is disposed in an adjacent memory chip of the plurality of memory chips, the adjacent memory chip being a memory chip that is below and closest to the defect.

30. The stacked semiconductor memory device according to claim 28, wherein other I/O buffers coupled to the defective TSV and located above the defect are configured so as not to be activated.

* * * * *